United States Patent [19]

Parrillo et al.

[11] 4,435,895
[45] Mar. 13, 1984

[54] PROCESS FOR FORMING COMPLEMENTARY INTEGRATED CIRCUIT DEVICES

[75] Inventors: Louis C. Parrillo, Warren; George W. Reutlinger, Florham Park; Li-Kong Wang, Martinsville, all of N.J.

[73] Assignee: Bell Telephone Laboratories, Incorporated, Murray Hill, N.J.

[21] Appl. No.: 365,396

[22] Filed: Apr. 5, 1982

[51] Int. Cl.³ .................. H01L 21/22; H01L 29/78
[52] U.S. Cl. .................. 29/571; 29/576 B;
29/577 C; 29/578; 148/1.5; 148/187; 148/190; 148/191; 357/23; 357/42; 357/52
[58] Field of Search .................. 29/571, 578, 576 B, 29/577 C; 148/1.5, 187, 190, 191; 357/23 CS, 42, 52

[56] References Cited

U.S. PATENT DOCUMENTS

| | | | |
|---|---|---|---|
| 3,418,180 | 12/1968 | Ku | 148/187 |
| 3,806,371 | 4/1974 | Barone | 357/23 CS |
| 3,865,654 | 2/1975 | Chang et al. | 29/571 X |
| 3,898,105 | 8/1975 | Mai et al. | 148/1.5 |
| 3,983,620 | 10/1976 | Spadea | 29/571 |
| 4,013,484 | 3/1977 | Boleky et al. | 148/1.5 |
| 4,104,784 | 8/1978 | Klein | 357/42 X |
| 4,110,899 | 9/1978 | Nagasawa et al. | 29/571 |
| 4,135,955 | 1/1979 | Gasner et al. | 148/187 |
| 4,214,359 | 7/1980 | Kahng | 29/571 |
| 4,277,291 | 7/1981 | Cerofouni et al. | 148/1.5 |
| 4,282,648 | 8/1981 | Yu et al. | 29/571 |
| 4,285,116 | 8/1981 | Meguro | 29/571 |
| 4,306,916 | 12/1981 | Wollesen et al. | 29/571 X |
| 4,391,650 | 7/1983 | Pfeifer et al. | 29/571 X |

OTHER PUBLICATIONS

Dennehy, Wm. J., "Non-Latching Integrated Circuits", RCA Technical Notes, Feb. 12, 1971, T.N. No. 876 (4 pages).

Copending application of L. C. Parrillo-R. S. Payne Case 1-5, Ser. No. 328,150, filed 12/7/81.

*Primary Examiner*—W. G. Saba
*Attorney, Agent, or Firm*—Arthur J. Torsiglieri

[57] ABSTRACT

A process for forming chanstops in complementary transistor integrated circuit devices which involves only a single extra masking step yet permits close control of the doping in the chanstops. The process is advantageously used starting with a twin-tub structure for forming CMOS integrated circuit devices.

13 Claims, 10 Drawing Figures

PROCESS FOR FORMING COMPLEMENTARY INTEGRATED CIRCUIT DEVICES

TECHNICAL FIELD

This invention relates to the manufacture of semiconductive integrated circuit devices and more particularly to such devices which include complementary types of elements.

BACKGROUND OF THE INVENTION

A significant trend in semiconductor manufacture is the steady increase in the number of elements that are included on a single chip. This has involved making the individual elements smaller and packing them closer to increase the density. With the increase in packing density, there has grown the need for isolation barriers between elements. Typically these isolation barriers take the form of guard rings or chanstops, which are regions of relatively high doping, to reduce leakage between neighboring elements, as might be caused by spurious inversion of the regions between active elements. Such inversions are apt to occur because of the voltages on the conductive runners overlying the chip used for applying operating voltages to the active elements. These chanstops advantageously are usually formed underneath a field oxide, which is a relatively thick oxide used to overlie the chip at passive regions between the active elements.

In complementary integrated circuits, there will be instances where contiguous transistors in the chip are of the same conductivity type in which case a single chanstop will generally be sufficient for isolation and instances where contiguous transistors are of opposite conductivity type in which case a chanstop of each type is usually desirable for optimum isolation. For saving space it is usually advantageous that this pair of complementary chanstops be back-to-back and it will be convenient to refer to such a structure as a twin chanstop.

One consideration which is pervasive in the manufacture of integrated circuit devices, particularly in high densities, is a fabrication process which results in low cost. Typically this requires a process which permits high yields, which end in turn is best served by a process which includes few critical steps, particularly masking steps requiring accurate registration.

One characteristic of a process in accordance with the present invention is that by the addition of a single masking step beyond those normally required there can be provided, where desired, single chanstops of either type or twin chanstops, self-aligned under the field oxide.

Another consideration which can be important for CMOS devices which employ chanstops is the need to maintain at a relatively high value in the breakdown voltage of the junction formed between the chanstop and other regions of the chip including a chanstop of the opposite type.

The present invention takes account of this consideration also.

SUMMARY OF THE INVENTION

The invention is a method for forming in a silicon chip complementary integrated circuits with appropriate chanstops at the surface of the chip self-aligned with an overlying field oxide.

The invention has particular usefulness when used as a modification of the twin-tub process described in application Ser. No. 328,150, filed Dec. 7, 1981, by Louis C. Parrillo and Richard S. Payne having the same assignee as the instant case, although it is not limited to this use.

A feature of the inventive process is the technique for forming the chanstops of either type or twin aligned with the field oxide. Basically it involves only a single extra masking step, after the initial formation of the twin-tub configuration, to those normally used to form a complementary pair of transistors. This masking step is used to confine the donor ion implantation (typically phosphorus or arsenic) only to the localized regions where n-type chanstops are to be formed, and follows the acceptor ion implantation, (typically boron) which is localized only to the regions where the chanstops are being formed and which uses for this purpose the mask previously used to define the regions where active transistors are to be formed. Use is thereafter made in the preferred embodiment of the known differences in segregation characteristics of donor and acceptor ions in a growing oxide/silicon interface to control the doping levels of the differently implanted regions and provide the desired doping in individual tubs.

In an illustrative embodiment of the invention there is first formed in each chip portion of a silicon wafer at least one pair of contiguous n-type and p-type tubs at a common surface of a layer of relatively high resistivity. The n-type tub is designed to accommodate the p-channel enhancement mode transistor and the p-type tub is designed to accommodate the n-channel enhancement mode transistor of a complementary pair of such transistors. Then there are formed the nitride/oxide islands which define where the active transistor regions are to be formed in the tubs. Advantageously the resist which is used to define the islands is also maintained over the islands and a p-type implant is done over all the exposed area. The resist-covered islands act as a mask and shield from this implantation the covered areas where the transistors are to be formed. The ions implanted in the exposed regions of each p-type tub will eventually form the p-type chanstops there.

Then the resist is removed from the islands and a new resist layer is formed over the p-type tub such that only the surfaces of the n-type tub regions not already covered by the nitride/oxide islands are exposed. This is the only additional masking operation that is required to the normal sequence of masking steps. Next, an n-type implant is performed. The implanted ions enter only the unprotected regions of the n-type tubs and these will eventually form the n-type chanstop there. Then the resist is removed from the surface of the p-type tub and the wafer is selectively oxidized in the regions not covered by the nitride/oxide islands. If the doses and energies of the two implants are adjusted appropriately, at the end of this oxidation step there will have been formed beneath the newly formed localized thick oxide regions p-type chanstops at the desired regions of the p-type tubs, n-type chanstops at the desired regions of the n-type tubs, and twin chanstops betwen contiguous p-type and n-type tubs.

One possible technique for achieving this desired result is to make the donor implant dose sufficiently higher than the acceptor implant dose that the donor ions overcompensate the acceptor ions in the n-type regions which have been exposed to both. This has the disadvantage that the p-n junction formed between the two chanstops tends to have a low reverse breakdown value, a factor which may be limiting for some applications.

In our preferred embodiment, boron is chosen as the acceptor and either phosphorus and arsenic as the donors and use is made of their known different segregation properties at a silicon/silicon oxide growing interface to relax the compensation problem. In particular, during the local oxidation step, boron tends to segregate in the growing oxide rather than accumulating in the silicon, whereas phosphorus and arsenic tend to "snowplow" and accumulate in the silicon rather than enter the growing oxide. As a result, there is increased the phosphorus or arsenic in the silicon region adjacent the oxide. There consequently is reduced the amount of phosphorus or arsenic needed to be implanted to ensure that regions, which are to serve as the n-type chanstops, have the requisite high donor doping. Moreover, of the two donors mentioned, the higher diffusion rate of phosphorus usually makes it preferred since it permits the use of lower implant energies for a desired depth of chanstop.

After formation of the chanstop regions, the p-channel transistors are formed in the n-type tubs and the n-channel transistors are formed in the p-type tubs in any suitable fashion. Advantageously, this involves acceptor ion implantation of localized regions of the n-type tubs using the gate electrode as a mask to form the source/drain regions of the p-type MOS transistors and donor ion implantations of localized regions of the p-type tubs using the gate electrode as a mask to form the source/drain regions of the n-type MOS transistors.

Alternatively other forms of transistors can be formed in the separate tub regions.

DETAILED DESCRIPTION

Figure 1:
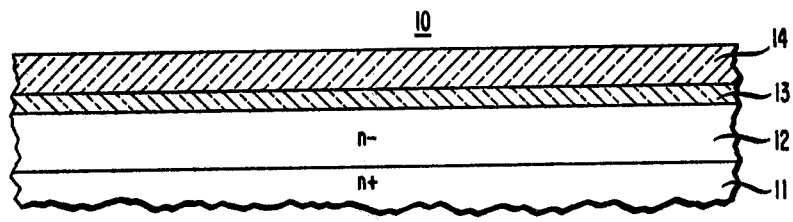
FIGS. 1 through 10 show cross-sections of a portion of a silicon wafer at various stages, when being processed in accordance with an illustrative example of the inventive process.

With reference now to the drawing, in FIG. 1 there is shown a portion of a silicon wafer 10 corresponding to a portion of a silicon chip in which there will be formed complementary transistors, for example, as part of a very large scale integrated circuit involving a number of complementary transistors. Typically after the processing is complete each wafer is divided into a number of chips for individual packaging. Like reference numbers are usually used throughout the figures to denote the same part or regions in different stages of processing. The drawing is not to scale because of the much smaller vertical dimensions typically involved.

There is first prepared in the silicon wafer portion being viewed a pair contiguous p-type and n-type tubs to form the preferred twin-tub structure in which will be formed the complementary transistors.

To this end, the silicon bulk region 11, which is n-type and of relatively low resistivity, first has grown thereon a lightly doped epitaxial n-type layer 12. The use of relatively lightly doped epitaxial layer on a relatively heavily doped substrate of the same resistivity type is known to provide protection against parasitic SCR-type latchup in CMOS devices.

Then a relatively thin, typically 350 Angstroms, silicon dioxide layer 13 is thermally grown on the surface of the epitaxial layer; and over it is formed a thicker silicon nitride layer 14, approximately 1200 Angstroms thick, preferably by a low pressure chemical vapor deposition process. As is known, the use of the intermediate oxide layer serves as a buffer layer and makes the silicon surface less vulnerable to high temperature steps.

Figure 2:
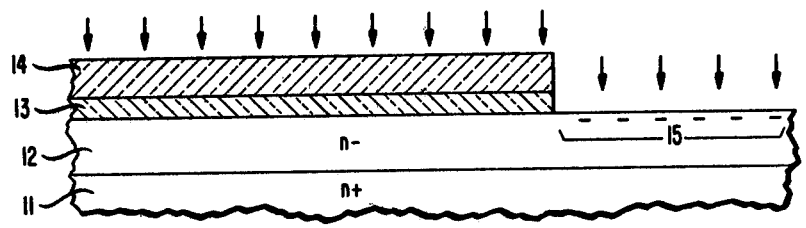

Next as shown in FIG. 2, the silicon nitride/silicon oxide layer 13,14 is patterned in known fashion to remove it from the regions 15 in which the n-type tubs are to be formed and thereafter the wafer is exposed to an implantation of donor ions, preferably phosphorus. The ions, shown by the negative sign, penetrate the silicon essentially only in region 15 where the layer 13,14 has been removed. The donor dosage and implantation energy are chosen to provide, after ion activation, the desired characteristics to the n-type tubs.

Figure 3:
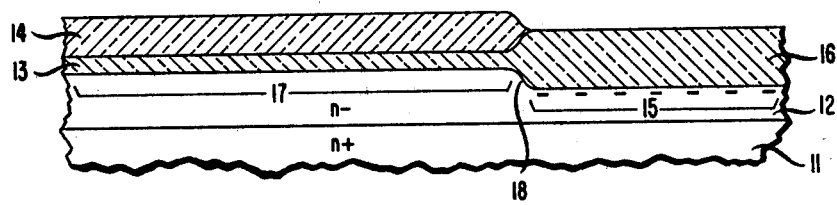

After this implantation, the wafer is cleaned in the usual fashion, and then as shown in FIG. 3 a relatively thick layer 16 of silicon dioxide, about 4000 Angstroms thick, is thermally grown selectively over the region 15. The region 17 underlying the remaining silicon nitride layer 14 remains essentially unaffected by this oxidation step because of the masking effect of the nitride layer 14.

Figure 4:
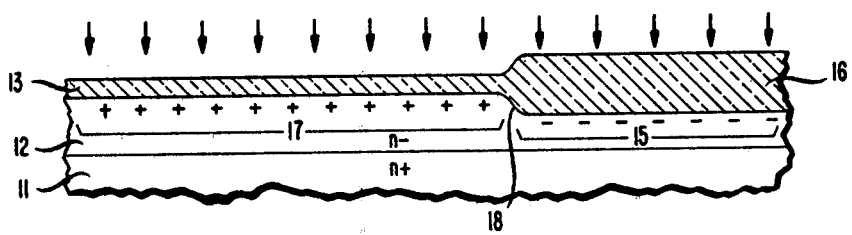

It is to be noted, as seen in FIG. 3, that this process leaves a small ledge 18 in the silicon at the edge of the donor implanted region. Next, the remainder of the silicon nitride layer 14 is selectively removed by a suitable etch (typically aqueous $H_3PO_4$) which does not significantly affect the silicon dioxide layers 13 and 16. Then as illustrated in FIG. 4, the wafer is bombarded with acceptor ions, advantageously boron, with an energy sufficient to penetrate readily the comparatively thin oxide layer 13 but insufficient to penetrate the thick oxide layer 16, and there is implanted selectively in region 17 acceptor ions, shown as plus signs, to a concentration adequate to convert, after ion activation, the region 17 to p-type with the doping desired for forming the p-type tub.

Figure 5:
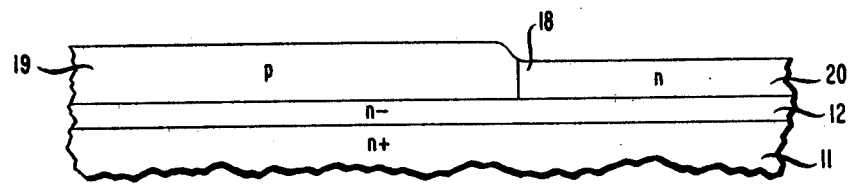

After removing the oxide layers 13 and 16 by suitable etching and after annealing to drive in and activate the implanted ions by moving them to lattice positions, there results a portion of a wafer as shown in FIG. 5 comprising a layer 12 in which are formed contiguous p-type tub 19 and n-type tub 20, forming a p-n junction at ledge 18. While the two tubs are shown penetrating to equal depths into layer 12, this is not necessary so long as each is deep enough to house the transistors to be incorporated therein. Up to this point, the processing is essentially the same as that described in the previously mentioned copending application to which reference can be had for more details.

It should be noted that in some instances it may be unnecessary to have used by this stage an annealing step specifically to drive in and activate the implanted ions since it may be possible to depend, for this purpose, on the heating steps that will occur in later steps of the process.

As the next step, there is defined in each tub the active region where its transistors are to be formed.

Figure 6:
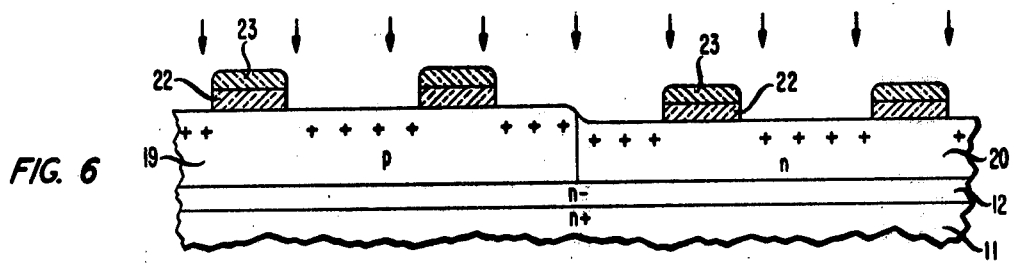

In commercial devices, there normally will be a plural number of transistors of the one appropriate type in each tub. Since the usual circuit includes more n-type transistors than p-type transistors, the p-type tubs which house the n-type transistors will normally be larger to accommodate more transistors. However, for simplifying the exposition, two transistors only are being shown in each tub. To this end, there is formed again over the entire surface a composite layer typically including a thermally grown silicon oxide layer about 100 Angstroms thick contiguous to the silicon chip and an overlying silicon nitride layer about 1200 Angstroms thick. Conventional processing is then used to form photoresist-covered silicon nitride/silicon oxide islands in each tub region, which will essentially define the regions of the tub in which its transistors will be formed. Anisotropic dry etching advantageously is used in known fashion to form the islands. In FIG. 6, the islands 22 are shown still covered with the photoresist protective coating 23 used to mask the islands during the reactive ion etching. The wafer is then bombarded with boron ions to implant selectively the uncovered surface regions as indicated by the positive signs. This advantageously is a high energy implant, typically using 100 thousand electron volt energies and a dose of $5 \times 10^{12}/cm^2$.

Figure 7:
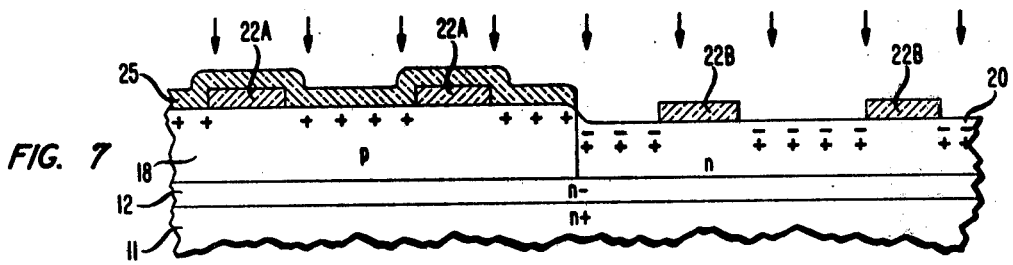

Then the photoresist 23 covering the islands is removed and a new photoresist layer is patterned to cover selectively all of the p-type tubs. This is best done by forming a photoresist layer over the entire wafer and using photolithographic techniques to remove selectively the portion covering the n-type tubs. In this process, use can be made of the ledge 18 in the silicon which effectively marks the interface between the p-type and n-type tubs. As seen in FIG. 7, the photoresist layer 25 covers only the surface of the p-type tub 19 including the islands 22A associated with this tub. Some portions of n-type tub 20 will be covered by the islands 22B but other portions will be exposed. Then the wafer is subjected to a relatively low energy phosphorus ion implant (typically 30 thousand electron volt energies) at a dose of $5 \times 10^{12}/cm^2$ to implant phosphorus ions in the exposed region of the n-type tub 20 and these are shown by negative signs. The regions of tub 20 underlying the islands 22B are kept substantially free of such ions. The photoresist 25 is then removed and the wafer cleaned with little disturbance of the islands 22A and 22B.

Then the wafer is heated in an oxidizing atmosphere for the selective oxidation of the exposed silicon surface lying between the islands, as in the conventional localized oxidation process, for growing the thick field oxide between the islands.

During the growth of the field oxide, advantage is taken of the fact that phosphorus (or arsenic) has a greater tendency than boron to move out of the growing oxide region and to accumulate in the underlying silicon. As a result, in regions of tub 20 where both boron and phosphorus were implanted, as the field oxide grows it tends to retain the boron but to reject the phosphorus. Consequently in the underlying silicon, the phosphorus concentration quickly builds up and soon overwhelms the boron even where the implanted concentrations of boron and phosphorus had been initially substantially equal. For this reason it is practical to make the two implants of substantially the same dosage, which has been found to be advantageous.

Figure 8:
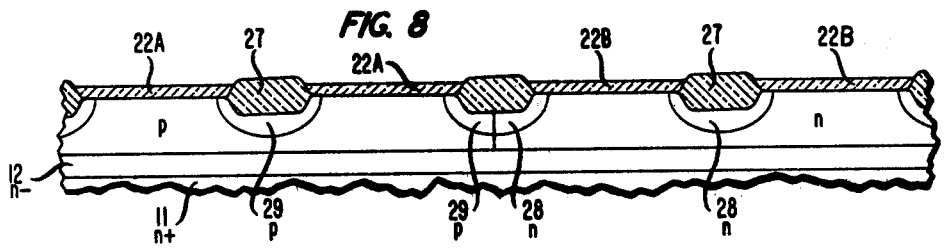

As a result, as shown in FIG. 8, there is formed in the regions of the n-type tub 20 underlying the field oxide 27 heavily phosphorus-doped n-type chanstops 28. Similarly, underlying the field oxide 27, in the p-type tub 19, there will be formed the heavily boron-doped p-type chanstops 29. Where the two tubs are contiguous, there is formed the twin chanstop with each individual chanstop 28,29 in its appropriate tub. Each chanstop accurately underlies the overlying field oxide.

Because of the fabrication process utilized, there is possible a high degree of control of the dopings of each of the various regions. This makes it possible to minimize the need for overcompensation, which in turn makes it feasible to maintain relatively high the reverse breakdown voltage between the chanstops and other regions of the tubs. Similarly, good control of the chanstop doping minimizes parasitic coupling to active devices.

Figure 9:
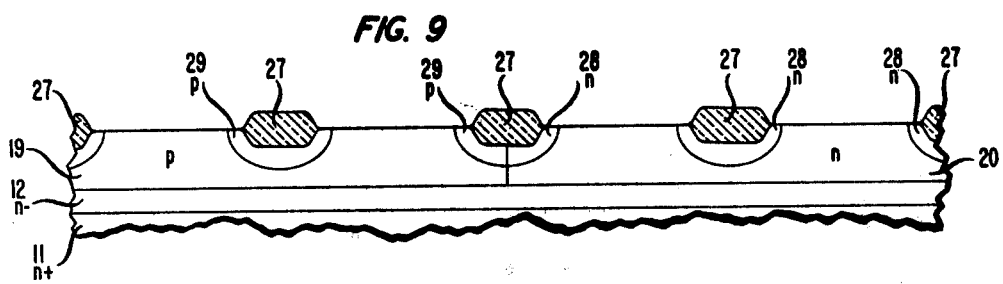

There are now removed the islands 22A,22B to expose the wafer where the active devices are to be formed to provide the structure shown in FIG. 9 where the p-type tub 19 includes p-type chanstops 29 at its surface, where they underlie the thick field oxide 27, and the n-type tub 20 includes n-type chanstops 28 at its surface where they underlie the thick field oxide 27.

In one typical application of the described process, each chanstop of a twin chanstop located at the interface between two tubs had a narrowest dimension of about 5 microns, while the single chanstops located on interior regions of a tub had a narrowest dimension of about 3.5 microns. In the n-type tub, the active region had an excess phosphorus doping of $2 \times 10^{16}$ per $cm^3$ and in the p-type tub, the active region had an excess boron doping also of $2 \times 10^{16}$ per $cm^3$. Each of the chanstops was a fraction of a micron deep and each p-type chanstop had an excess boron concentration of about $4 \times 10^{16}$ ions per cubic centimeter, and each n-type chanstop had an excess phosphorus concentration of about $1 \times 10^{17}$ ions per cubic centimeter.

After this stage of processing is reached, a variety of techniques are available for further fabrication, and a particular choice would be dictated primarily by the end result sought.

The invention is expected to find principal application to the situation where complementary enhancement-mode MOS transistors are to be formed in the separate active regions, the n-channel enhancement-mode type in the p-type tubs and the p-channel enhancement-mode type in the n-type tubs. However, in some instances, it may be desirable to form depletion-type transistors in one or both tubs.

Also in some instances, it may prove advantageous to form one or more bipolar junction transistor or junction field-effect transistor in one or more of the tubs.

One illustrative technique for forming complementary enhancement-mode MOS transistors in the tubs begins by forming a thin gate oxide layer over the surface of each of the active regions in the p-type and n-type tubs. This is followed by formation of the gate electrodes. Usually it is advantageous to use the same doped-polycrystalline silicon material for the gate electrode conductor of each of the two transistor types and to have the same threshold voltage for the two types. This may require some extra treatment of the surface of one of the two tubs if this factor was not adequately provided for when the two tubs were formed initially. For example, if n-doped polysilicon is to be used for the gate conductor, it may be necessary to use a shallow boron implant at the surface of the n-tubs to make more positive the threshold voltage of the p-channel transistors to be formed there. In this instance the p-type tubs would be masked with a photoresist while boron ions were implanted into the n-tubs.

After any threshold adjustment implant, the photoresist mask used is removed and a polysilicon layer is deposited over the surface of the chip. The polysilicon layer is then patterned to define the gate electrodes which are localized appropriately in the active regions and also to define any conductive runners to be used for interconnection purposes. There then may be removed at this time the thin oxide remaining on the exposed regions where the sources and drains are to be located, but typically it is preferred to do the source and drain implantations through this oxide so that it can protect the silicon surface from damage.

Then there follows a boron implant which serves to form the p-type source and drain zones of the p-channel transistors in the n-type tubs. It typically is unnecessary to mask the p-type tub during this operation since the boron implanted there can readily be overdoped subsequently by a phosphorus implantation. However, before such phosphorus implantation to form the n-type source and drain regions of the n-channel transistors in the p-type tubs, the n-type tubs are masked against such implantation. This is readily done by appropriately patterning a photoresist layer deposited initially uniformly over the wafer. After the mask is provided, the wafer is exposed to a phosphorus ion beam for formation of the desired source and drain regions of the n-channel transistor. This implantation typically also serves to dope the polysilicon gate electrodes and any runners to increase their conductivity.

It will generally be usual next to provide a protective phosphorus-doped glass layer over the surface of the wafer and flow it at elevated temperature to smooth out the topography. This heating also serves to activate the source and drain implants. Then openings are formed to the silicon surface through which source, drain and gate electrode connections are made to the appropriate regions for handling the operating voltages.

Figure 10:
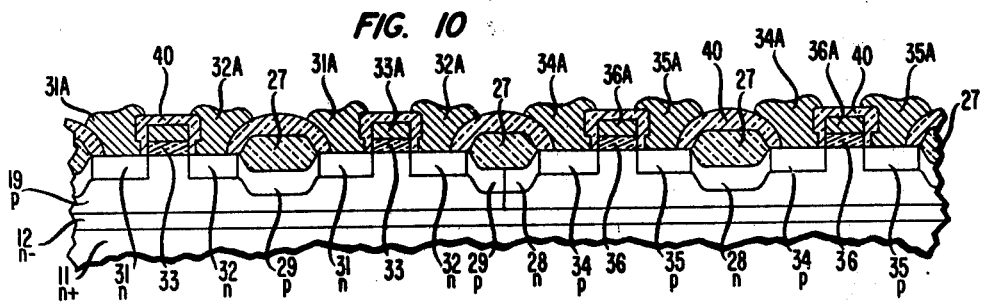

In FIG. 10, there is shown the basic structure of a portion of a completed device made in the fashion described. It includes the portion of a silicon wafer including the bulk layer 11 on which lies the epitaxial layer 12, which includes the p-type tub 19 and the n-type tub 20. Within the p-type tub 19 are a pair of n-channel enhancement-mode transistors formed by the n-type source/drain regions 31,32 with their electrodes 31A,32A and the gate oxides 33 with their gate electrodes 33A. Within the n-type tub 20 are a pair of p-channel enhancement-mode transistors formed by the p-type source/drain regions 34,35, their electrodes 34A,35A, the gate oxides 36 and their gate electrodes 36a. Separating the individual transistors are portions of the thick field oxide 27 under which lie the chanstop. Separating the two n-type transistors in the p-type tub is the single p-type chanstop 29, and separating the two p-type transistors in the n-type tub is the single n-type chanstop 28. Separating the two tubs is the twin chanstop 28,29. A phosphorus-doped glass 40 covers all portions of the surface of the chip through which protrudes the various electrodes.

It should be understood that the specific process described is illustrative of the preferred embodiment of the invention but that variations may be made consistent with the general principles of the invention. For example, though it has proved advantageous to apply the invention to twin-tub technology, the principles should be applicable to other technologies that provide surface regions of appropriate doping for the formation of complementary transistors in such surface regions.

What is claimed is:

1. In the manufacture of complementary integrated circuits in a silicon wafer, the process for forming complementary chanstops at the surface of the water between regions where transistors are to be formed comprising the steps of, providing a silicon wafer whose surface includes p-type and n-type regions in which transistors are to be formed, implanting acceptor ions selectively in the surface regions of the wafer where chanstops are to be formed in both the p-type and n-type regions, implanting donor ions selectively only into the n-type regions where the n-type chanstops are to be formed, the acceptor ions being chosen to have a greater tendency to segregate in a growing oxide than the donor ions and the dosages being substantially similar, and heating the wafer in an oxidizing atmosphere while the portions of the wafer in which chanstops are to be formed are selectively exposed for oxidizing the surface regions where chanstops are to be formed, whereby as a result of the difference in segregation characteristics, underlying the oxide there are formed in the p-type surface regions localized p-type chanstops where acceptor ions are in excess and in the n-type surface regions localized n-type chanstops where the donor ions are in excess.

2. The process of claim 1 in which boron is the acceptor and either phosphorus or arsenic is the donor.

3. The process of claim 1 in which the silicon wafer includes at its surface p-type and n-type tubs for forming the p-type and n-type regions, the tubs having been formed in a layer of higher resistivity.

4. The process of claim 1 further characterized in that where p-type and n-type surface regions are contiguous and form a p-n junction, there is formed a twin chanstop underlying the oxide.

5. In the manufacture of integrated circuits which include complementary transistors and in which chanstops are provided for isolation between transistors, the steps of, forming in a silicon wafer surface regions of opposite conductivity types, providing an implantation mask over those portions of each region in which transistors are to be formed, exposing the wafer to a boron ion beam of a first dosage for implanting boron in unmasked portions of both types of surface regions, providing an implantation mask over the p-type surface regions, exposing the wafer to a beam of ions of a second dosage taken from the group consisting of phosphorus and arsenic ions for implanting such ions in unmasked portions of the n-type surface regions, the first and second dosages being substantially the same, exposing to an oxidizing atmosphere selectively those portions of the surface regions in which chanstops are to be formed while heating the wafer in the oxidizing atmosphere for a time to oxidize the exposed portions for forming beneath the oxide p-type chanstops where boron ions were implanted and n-type chanstops where both types of ions were implanted, and forming transistor devices in the regions between the regions in which chanstops were formed.

6. In the manufacture of CMOS integrated circuits, the steps of forming in a silicon wafer contiguous surface regions of opposite conductivity types, forming islands of composite layers of silicon nitride and silicon oxide over various portions of the surface regions, implanting boron selectively into the surface regions of both conductivity types, not covered by islands, covering the p-type surface regions with an implantation mask, implanting ions from the group consisting of arsenic and phosphorus selectively into the n-type surface regions not covered by islands, the dosage being substantially the same for both implantations, removing the implantation mask from the p-type surface regions, heating the wafer in an oxidizing atmosphere for oxidizing the surface regions not covered by islands and forming under the oxidized regions p-type chanstops in the p-type surface regions and n-type chanstops in the n-type surface regions, removing the islands, and forming n-type MOS transistors in the p-type surface regions and p-type MOS transistors in the n-type surface regions previously covered by islands.

7. The process of claim 6 in which the contiguous surface regions are moderately doped regions formed in a more lightly doped layer.

8. The process of claim 6 in which the more lightly doped layer overlies a more heavily doped layer.

9. The process of claim 6 in which the dosage of the boron implant is substantially the same as that of the phosphorus or arsenic implant.

10. The process of claim 9 in which the process of forming contiguous surface regions of opposite conductivity type includes the steps of forming on a substrate of relatively low resistivity an epitaxial layer of higher resistivity and like type, forming a composite silicon oxide-silicon nitride layer over the epitaxial layer and removing the composite layer from selected regions of the epitaxial layer, implanting donor ions selectively into regions of the epitaxial layer where the composite layer has been removed, heating the substrate in an oxidizing atmosphere for forming over the implanted region an oxide layer appreciably thicker than the oxide layer in the composite layer, removing the silicon nitride portion of the composite layer, and implanting acceptor ions selectively into regions of the epitaxial layer covered only by the remaining oxide layer portion of the composite layer, whereby there results in the epitaxial layer contiguous regions rich in either acceptor or donor implanted ions.

11. The process of claim 9 in which the donor and acceptor ions implanted in the epitaxial layer are of phosphorus and boron, respectively.

12. In the manufacture of complementary integrated circuits in a silicon wafer, the process for forming complementary chanstops at the surface of the wafer comprising the steps of, providing a silicon wafer whose surface includes p-type and n-type regions, masking those portions of both regions where transistors are to be formed leaving unmasked those portions where chanstops are to be formed, implanting acceptor ions selectively into portions where chanstops are to be formed in both types of surface regions and donor ions into portions where chanstops are to be formed selectively only in the n-type surface regions, the acceptor being chosen to have a greater tendency to segregate in a growing oxide than the donor ions and the dosages being substantially similar, and heating the wafer in an oxidizing atmosphere while the portions of the wafer in which chanstops are to be formed are selectively exposed for oxidizing the surface regions where chanstops are to be formed for a time sufficient that as a result of the difference in segregation characteristics underlying the oxide there are formed in the p-type surface regions localized p-type chanstops where acceptor ions are in excess and in the n-type surface regions localized n-type chanstops where the donor ions are in excess.

13. A process in accordance with claim 12 in which the silicon wafer has a surface which is initially of relatively high resistivity and in which portions of the surface are selectively implanted with acceptor ions and the remaining portions are selectively implanted with donor ions whereby the wafer has a surface which includes p-type and n-type regions which are contiguous and which are of relatively lower resistivity than the original surface.

* * * * *